(12) United States Patent
Markytan et al.

(10) Patent No.: US 9,406,847 B2
(45) Date of Patent: Aug. 2, 2016

(54) OPTOELECTRONIC SEMICONDUCTOR COMPONENT, CONVERSION-MEDIUM LAMINA AND METHOD FOR PRODUCING A CONVERSION-MEDIUM LAMINA

(71) Applicant: OSRAM Opto Semiconductors GmbH, Regensburg (DE)

(72) Inventors: Ales Markytan, Regensburg (DE); Christian Gärtner, Regensburg (DE); Hans-Christoph Gallmeier, Regensburg (DE); Ion Stoll, Tegernheim (DE); Herbert Brunner, Sinzing (DE); Thomas Schlereth, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/420,310

(22) PCT Filed: Jul. 30, 2013

(86) PCT No.: PCT/EP2013/066011
§ 371 (c)(1),
(2) Date: Feb. 6, 2015

(87) PCT Pub. No.: WO2014/023617
PCT Pub. Date: Feb. 13, 2014

(65) Prior Publication Data
US 2015/0200339 A1    Jul. 16, 2015

(30) Foreign Application Priority Data
Aug. 8, 2012    (DE) .......................... 10 2012 107 290

(51) Int. Cl.
*H01L 33/50*    (2010.01)

(52) U.S. Cl.
CPC ............ *H01L 33/501* (2013.01); *H01L 33/505* (2013.01); *H01L 33/508* (2013.01); *H01L 33/504* (2013.01); *H01L 2924/0002* (2013.01)

(58) Field of Classification Search
CPC . H01L 25/0753; H01L 33/501; H01L 33/505; H01L 33/507; H01L 33/54; H01L 33/62; H01L 2224/45144; H01L 2224/48091; H01L 33/508
USPC ....................................................... 257/98, 99
See application file for complete search history.

(56) References Cited

U.S. PATENT DOCUMENTS

| 6,642,652 | B2 | 11/2003 | Collins, III et al. |
| 7,812,516 | B2 | 10/2010 | Maruyama et al. |

(Continued)

FOREIGN PATENT DOCUMENTS

| DE | 102010061848 A1 | 5/2012 |
| EP | 1693904 A2 | 8/2006 |

(Continued)

*Primary Examiner* — Whitney T Moore
*Assistant Examiner* — Changhyun Yi
(74) *Attorney, Agent, or Firm* — Slater Matsil, LLP

(57) ABSTRACT

In at least one embodiment, the semiconductor component includes an optoelectronic semiconductors chip. Furthermore, the semiconductor component includes a conversion-medium lamina, which is fitted to a main radiation side of the semiconductor chip and is designed for converting a primary radiation into a secondary radiation. The conversion-medium lamina includes a matrix material and conversion-medium particles embedded therein. Furthermore, the conversion-medium lamina includes a conversion layer. The conversion-medium particles are situated in the at least one conversion layer. The conversion-medium particles, alone or together with diffusion-medium particles optionally present, make up a proportion by volume of at least 50% of the conversion layer. Furthermore, the conversion-medium lamina includes a binder layer containing the conversion-medium particles with a proportion by volume of at most 2.5%.

20 Claims, 3 Drawing Sheets

(56) References Cited

U.S. PATENT DOCUMENTS

| | | |
|---|---|---|
| 8,294,357 B2 | 10/2012 | Washizu et al. |
| 8,796,712 B2 | 8/2014 | Ooyabu et al. |
| 8,882,299 B2 | 11/2014 | Kinomoto et al. |
| 2003/0080341 A1* | 5/2003 | Sakano ............... B29C 67/08 257/79 |
| 2003/0214233 A1 | 11/2003 | Takahashi et al. |
| 2006/0105485 A1* | 5/2006 | Basin ..................... H01L 24/97 438/27 |
| 2008/0122343 A1 | 5/2008 | Maruyama et al. |
| 2008/0142816 A1 | 6/2008 | Bierhuizen et al. |
| 2008/0265268 A1* | 10/2008 | Braune ............... H01L 33/507 257/98 |
| 2011/0309393 A1 | 12/2011 | Greenwood |
| 2012/0098017 A1 | 4/2012 | Komatsu et al. |
| 2013/0207151 A1 | 8/2013 | Eberhardt et al. |
| 2013/0334558 A1 | 12/2013 | Pindl et al. |

FOREIGN PATENT DOCUMENTS

| | | |
|---|---|---|
| JP | 2000022222 A1 | 1/2000 |
| JP | 2003110153 A | 4/2003 |
| JP | 2005244075 A | 9/2005 |
| JP | 2008135537 A | 6/2008 |
| JP | 2011202148 A | 10/2011 |
| JP | 2011238811 A | 11/2011 |
| JP | 2012015175 A | 1/2012 |
| JP | 2012138561 A | 7/2012 |
| WO | 2010131402 A1 | 11/2010 |
| WO | 2012045772 A1 | 4/2012 |
| WO | 2012084516 A1 | 6/2012 |

* cited by examiner

OPTOELECTRONIC SEMICONDUCTOR COMPONENT, CONVERSION-MEDIUM LAMINA AND METHOD FOR PRODUCING A CONVERSION-MEDIUM LAMINA

This patent application is a national phase filing under section 371 of PCT/EP2013/066011, filed Jul. 30, 2013, which claims the priority of German patent application 10 2012 107 290.6, filed Aug. 8, 2012, each of which is incorporated herein by reference in its entirety.

TECHNICAL FIELD

An optoelectronic semiconductor component is specified. Furthermore, a conversion-medium lamina for an optoelectronic semiconductor component and a method for producing a conversion-medium lamina are specified.

SUMMARY

In accordance with at least one embodiment, the optoelectronic semiconductor component comprises at least one optoelectronic semiconductor chip. The semiconductor chip is designed for generating a primary radiation. The primary radiation is preferably ultraviolet radiation, blue light or green light. Preferably, the semiconductor chip is a light emitting diode chip, LED chip for short. The semiconductor component can then be a light emitting diode module.

In accordance with at least one embodiment, the semiconductor component comprises at least one conversion-medium lamina. The conversion-medium lamina is designed to partly or completely absorb the primary radiation and to partly or completely convert it into a secondary radiation. The secondary radiation has, in particular, a higher wavelength than the primary radiation. A spectral width of the secondary radiation can exceed a spectral width of the primary radiation.

In accordance with at least one embodiment, the conversion-medium lamina is indirectly or directly attached to a main radiation side of the semiconductor chip. That can mean that the conversion-medium lamina touches the main radiation side or that only a connection medium for fixing the conversion-medium lamina is situated between the main radiation side and the conversion-medium lamina. The main radiation side of the semiconductor chip is, in particular, that main side at which the semiconductor chip emits a significant proportion of radiation during use as intended. By way of example, the main radiation side faces away from a carrier. The main radiation side can be formed by a radiation-transmissive substrate of the semiconductor chip or by an epitaxially grown semiconductor material or by a sealing layer of the semiconductor chip.

In accordance with at least one embodiment, the conversion-medium lamina comprises a matrix material. The matrix material is preferably transparent to the primary radiation and/or to the secondary radiation. By way of example, the matrix material is a silicone, an epoxide or a silicone-epoxide hybrid material.

In accordance with at least one embodiment, the conversion-medium lamina comprises at least one type or a plurality of types of conversion-medium particles. The conversion-medium particles are embedded into the matrix material. That can mean that at least a portion of the conversion-medium particles is in direct contact with the matrix material. It is not necessary for all the conversion-medium particles to be surrounded all around by the matrix material.

In accordance with at least one embodiment, the conversion-medium lamina comprises a conversion layer. The conversion layer is, in particular, such a layer of the conversion-medium lamina which is situated closest to the semiconductor chip. The conversion-medium particles are situated in the conversion layer.

In accordance with at least one embodiment, the conversion-medium particles, alone or together with diffusion-medium particles optionally present, are present with a proportion by volume of at least 50% or of at least 60%. In other words, the conversion-medium particles are close- or virtually close-packed in the conversion layer.

In accordance with at least one embodiment, the conversion-medium lamina comprises at least one binder layer. The binder layer is, in particular, that layer of the conversion-medium lamina which is situated furthest away from the semiconductor chip.

In accordance with at least one embodiment, a proportion by volume of the conversion-medium particles in the binder layer is at most 2.5% or at most 1% or at most 0.5%. Preferably, the binder layer is free of the conversion-medium particles. However, conversion-medium particles can be situated in the binder layer.

In accordance with at least one embodiment, the binder layer directly succeeds the at least one conversion layer. The binder layer produces a mechanical connection of the conversion-medium particles among one another. The binder layer can be the layer that mechanically supports the conversion-medium lamina.

In accordance with at least one embodiment, the binder layer and the conversion layer in each case contain a matrix material. In particular, the binder layer and the conversion layer comprise an identical matrix material. By way of example, the conversion-medium particles are embedded into the matrix material.

In at least one embodiment, the optoelectronic semiconductor component comprises one or a plurality of optoelectronic semiconductor chips for generating a primary radiation. Furthermore, the semiconductor component comprises at least one conversion-medium lamina which is attached to a main radiation side of the semiconductor chip and which is designed for at least partly converting the primary radiation into a secondary radiation. The conversion-medium lamina comprises a matrix material and conversion-medium particles embedded therein. Furthermore, the conversion-medium lamina comprises one or a plurality of conversion layers which are situated closest to the semiconductor chip. The conversion-medium particles are situated in the at least one conversion layer. The conversion-medium particles, alone or together with diffusion-medium particles optionally present, make up a proportion by volume of at least 50% of the conversion layer. Furthermore, the conversion-medium lamina comprises a binder layer which is situated furthest away from the semiconductor chip. The conversion-medium particles are present in the binder layer with a proportion by volume of at most 2.5%.

Such a conversion-medium lamina can be produced efficiently by means of electrophoresis. Furthermore, a good thermal contact between the conversion-medium particles and the semiconductor chip can be produced in the case of such a conversion-medium lamina.

Another possibility for producing a conversion-medium lamina consists in mixing conversion-medium particles into a matrix material and producing a conversion layer by sedimentation of the conversion-medium particles. In the case of such sedimentation, however, there are limitations with regard to the useable particle sizes. Moreover, a proportion by volume of the conversion-medium particles in the conversion layer is comparatively low, since generally at least small portions of the matrix material are situated between adjacent conversion-medium particles.

A further possibility for applying a conversion medium to a semiconductor chip consists in depositing the conversion-medium particles directly on the semiconductor chip, for example, by electrophoresis. In this case, however, color locus control of the component is comparatively difficult, since a reproducibility of the process depends on the exact geometry, and tolerances during mounting of the semiconductor chip can also influence the resulting color locus by virtue of a varying layer thickness of the conversion-medium layer.

In accordance with at least one embodiment, adjacent conversion-medium particles directly touch one another. In other words, at some points between at least some of the conversion-medium particles there is no matrix material present. A particularly high packing density of the conversion-medium particles can be obtained as a result.

In accordance with at least one embodiment, the conversion-medium lamina comprises exactly two, exactly three or more than three of the conversion layers. It is likewise possible for the conversion-medium lamina to comprise exactly one conversion layer. If the conversion-medium lamina comprises a plurality of conversion layers, then the latter can comprise the same or different conversion-medium particles. The conversion layers could directly succeed one another.

In accordance with at least one embodiment, the conversion layer situated closest to the semiconductor chip comprises first conversion-medium particles. Moreover, a further conversion layer comprises second conversion-medium particles. The further conversion layer succeeds the conversion layer situated closest to the semiconductor chip.

In accordance with at least one embodiment, the first conversion-medium particles are designed for generating a longer-wave radiation than the second conversion-medium particles. By way of example, the first conversion-medium particles generate red light from blue light and the second conversion-medium particles generate green light from blue light. As an alternative thereto, it is also possible for the first conversion-medium particles to be designed for generating shorter-wave light in comparison with the second conversion-medium particles.

In accordance with at least one embodiment, the first conversion-medium particles situated in the conversion layer situated closest to the semiconductor chip have a smaller average diameter than the second conversion-medium particles. By way of example, the average diameters differ by at least a factor of 1.5 or by at least a factor of 2 or by at least a factor of 3. As an alternative thereto, the first conversion-medium particles can also have a larger average diameter than the second conversion-medium particles.

In accordance with at least one embodiment, the first and/or the second conversion-medium particles, in each case alone or together with the diffusion-medium particles optionally present, are present in the conversion layers in each case in a close-packed fashion. In particular, the conversion-medium particles, alone or together with the optional diffusion-medium particles, can form many continuous heat conducting paths in the conversion layers. The conversion-medium particles and/or the diffusion-medium particles therefore preferably have a concentration far above a percolation threshold.

In accordance with at least one embodiment, a proportion by volume of the conversion-medium particles, alone or together with the optional diffusion-medium particles, is at least 70% or at least 80% or at least 90% of the closest packing of the corresponding particles. If the conversion-medium particles have, for example, a spherical shape and only a negligible diameter distribution, then the closest packing of said conversion-medium particles is the closest sphere packing. For the closest sphere packing, a proportion by volume is approximately 74%.

In the case of spherical particles having a non-negligible distribution with regard to the diameters, it is possible for the proportion by volume to be above the proportion by volume for the closest sphere packing for spherical particles of identical diameters.

In accordance with at least one embodiment, the first conversion-medium particles and/or the second conversion-medium particles have an average diameter of at least 0.5 μm or of at least 1.0 μm. Alternatively or additionally, the average diameter is at most 5.0 μm or at most 4.0 μm or at most 3.0 μm.

In accordance with at least one embodiment, the second conversion-medium particles and/or the first conversion-medium particles have an average diameter of at least 5 μm or of at least 7.5 μm or of at least 10 μm. Alternatively or additionally, the average diameter is at most 25 μm or at most 20 μm or at most 15 μm.

In accordance with at least one embodiment, the semiconductor component comprises a carrier having a carrier top side. The carrier is preferably the component part that mechanically stabilizes and supports the semiconductor component. The semiconductor chip is indirectly or directly attached to the carrier top side. In particular, only a connection medium for fixing the semiconductor chip is situated between the carrier top side and the semiconductor chip.

In accordance with at least one embodiment, the conversion-medium lamina is arranged in a manner spaced apart from the carrier. That is to say that the conversion-medium lamina does not touch the carrier. A distance between the carrier and the conversion-medium lamina corresponds, for example, at least to the thickness of the semiconductor chip.

In accordance with at least one embodiment, the conversion-medium lamina has a thickness of at least 30 μm or of at least 50 μm or of at least 70 μm. Alternatively or additionally, the thickness of the conversion-medium lamina is at most 300 μm or at most 200 μm.

In accordance with at least one embodiment, the binder layer has a proportion of the thickness of the conversion-medium lamina of at least 60% or of at least 70% or of at least 80%. Alternatively or additionally, said proportion is at most 95% or at most 90% or at most 85%. In other words, the binder layer makes up a large part of the thickness of the conversion-medium lamina.

In accordance with at least one embodiment, a transition region between the binder layer and the directly adjoining conversion layer is thin. Thin can mean that the transition region amounts to a thickness of at most 1.5 times, at most 1.0 times or at most 0.5 times the average diameter of the conversion-medium particles of said adjoining conversion layer. The same can correspondingly apply to a transition region between two adjacent conversion layers, wherein in this case, in particular, the average diameter of the smaller conversion-medium particles is used. In other words, the conversion-medium particles of the conversion layers then do not intermix and the individual conversion layers are sharply delimited from one another.

In accordance with at least one embodiment, the conversion layer situated closer to the semiconductor chip also comprises conversion-medium particles from the at least one further conversion layer. A proportion by volume of the conversion-medium particles from the further conversion layer is then, for example, at least 2.5% by volume or at least 5% by volume and alternatively or additionally at most 20% by volume or at most 15% by volume. In particular, the conversion-medium particles from the further conversion layer have a small average diameter than the conversion-medium particles of the conversion layer situated closer to the semiconductor chip.

In accordance with at least one embodiment, the further conversion layer situated further away from the semiconductor chip is free of conversion-medium particles from the conversion layer situated closer to the semiconductor chip. In other words, it is therefore possible that an intermixing of conversion-medium particles is possible toward the semiconductor chip, but is prevented in a direction away from the semiconductor chip relative in each case to the conversion-medium particles occurring as a majority in the respective conversion layer.

In accordance with at least one embodiment, the conversion-medium lamina is restricted to the main radiation side of the semiconductor chip. It is therefore possible that the conversion-medium lamina does not or does not significantly project laterally beyond the main radiation side. It is likewise possible that the conversion-medium lamina and the semiconductor chip terminate laterally flush all around with a tolerance of at most 5 µm or at most 50 µm.

In accordance with at least one embodiment, the conversion-medium lamina comprises diffusion-medium particles. The diffusion-medium particles are preferably formed from a radiation-transmissive material. By way of example, the diffusion-medium particles are formed from silicon oxide, from aluminum oxide or from aluminum nitride. The diffusion-medium particles can have a spherical basic shape.

In accordance with at least one embodiment, the diffusion-medium particles have an average diameter of at least 2 µm or of at least 3 µm. Alternatively or additionally, the average diameter of the diffusion-medium particles is at most 8 µm or at most 6 µm or at most 5 µm.

In accordance with at least one embodiment, a proportion by volume of the diffusion-medium particles in the at least one conversion layer or in all conversion layers which comprise diffusion-medium particles is at most 20% or at most 10% or at most 5% or at most 2.5%. It is furthermore possible for the diffusion-medium particles to be present in the binder layer with a proportion by volume of at least 1.0% or of at least 2.5% or of at least 5%. Said proportion by volume in the binder layer is, for example, at most 30% or at most 20% or at most 15%.

Furthermore, a conversion-medium lamina is specified. The conversion-medium lamina is configured, in particular, for an optoelectronic semiconductor component as specified in connection with one or more of the embodiments mentioned above. Features of the conversion-medium lamina are therefore also disclosed for the optoelectronic semiconductor component and vice versa.

In accordance with at least one embodiment, the conversion-medium lamina is mechanically self-supporting. That can mean that the conversion-medium lamina can be handled by means of a pick-and-place machine. In particular, the conversion-medium lamina forms a mechanically continuous unit that does not decompose during use as intended.

Furthermore, a method for producing a conversion-medium lamina which can be used for an optoelectronic semiconductor component is specified. Features of the method are therefore also disclosed for the conversion-medium lamina and for the optoelectronic semiconductor component and vice versa.

In at least one embodiment, the method comprises at least or exactly the following steps: providing an intermediate carrier having a top side, applying the conversion-medium particles to the top side, applying the matrix material to the conversion-medium particles, curing the matrix material, and detaching the conversion-medium lamina from the intermediate carrier.

In accordance with at least one embodiment, applying the conversion-medium particles is carried out by means of electrophoresis. The matrix material is preferably applied by means of a liquid phase process, for example, dispensing or printing.

In accordance with at least one embodiment of the method, the step of applying the matrix material succeeds the step of applying the conversion-medium particles. In other words, all the conversion-medium particles can then be applied before the matrix material is added.

In accordance with at least one embodiment, the method is carried out with the aid of an intermediate carrier. The intermediate carrier has a carrier top side. The intermediate carrier comprises an electrically insulating masking layer or such a masking layer is attached to the top side of the intermediate carrier. The masking layer preferably comprises a multiplicity of openings. The openings are designed for electrophoretically depositing the conversion-medium particles in a targeted manner in the openings.

In accordance with at least one embodiment, an electrically conductive material is situated in the openings. The electrically conductive material can be exposed and form a top side of the intermediate carrier. As an alternative thereto, it is possible for the electrically conductive layer to be covered by a further insulating layer, which is thin in comparison with the masking layer.

In accordance with at least one embodiment of the method, a shape of the conversion-medium laminae, in particular as seen in plan view, is predefined by the openings. It is also possible for the openings to act as a kind of mold for the matrix material. Specifically, singulation of the conversion-medium laminae, after detachment from the intermediate carrier, can be dispensed with.

BRIEF DESCRIPTION OF THE DRAWINGS

An optoelectronic semiconductor component described here, a conversion-medium lamina described here and a method described here are explained in greater detail below on the basis of exemplary embodiments with reference to the drawing. In this case, identical reference signs indicate identical elements in the individual figures. In this case, however, relations to scale are not illustrated; rather, individual elements may be illustrated with an exaggerated size in order to afford a better understanding.

In the figures.

DETAILED DESCRIPTION OF ILLUSTRATIVE EMBODIMENTS

Figure 1:
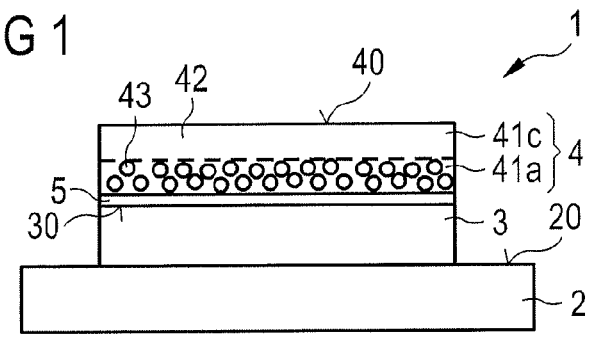
FIG. 1 shows a schematic sectional illustration of one exemplary embodiment of an optoelectronic semiconductor component described here.

FIG. 1 shows one exemplary embodiment of an optoelectronic semiconductor component 1 in a sectional illustration. The semiconductor component comprises a carrier 2 having a carrier top side 20. Preferably, the carrier 2 comprises—not depicted—conductor tracks and electrical contact structures for connecting an optoelectronic semiconductor chip 3. Furthermore, the carrier 2 can comprise a heat sink—not depicted.

The semiconductor chip 3 which is preferably a light emitting diode chip is attached to the carrier top side 20. A main radiation side 30 of the semiconductor chip 3 faces away from the carrier 2. By way of example, the semiconductor chip 3 emits blue light during operation.

Furthermore, the semiconductor component 1 comprises a conversion-medium lamina 4. The conversion-medium lamina 4 is attached to the main radiation side 30 by means of a connection medium 5. The connection medium 5 is, in particular, a silicone adhesive. A thickness of the connection medium 5 is preferably at most 6 µm or at most 4 µm.

The conversion-medium lamina 4 comprises a conversion layer 41a and a binder layer 41c. The two layers 41a, 41c directly succeed one another and are mechanically fixedly connected. In the figures, the layers 41a, 41c of the conversion-medium lamina 4 are symbolically separated from one another by a dashed line.

Conversion-medium particles 43 are close-packed in the conversion layer 41a. A proportion by volume of the conversion-medium particles 43 in the conversion layer 41a is approximately 75%, for example. The conversion-medium particles 43 can be approximately spherically shaped. The conversion-medium particles 43 are based, for example, on a rare-earth-doped garnet, silicate, nitride, orthosilicate or oxynitride. By way of example, the conversion-medium particles 43 are designed for generating yellow light.

The binder layer 41c is free of the conversion-medium particles 43 and substantially consists of a matrix material 42. The conversion-medium particles 43 are also mechanically connected to one another by the matrix material 42. A mechanical integrity of the conversion-medium lamina 4 is obtained via the matrix material 42. The matrix material 42 is, for example, a methylsiloxane or a phenylsiloxane. A thickness of the binder layer 41c preferably exceeds a thickness of the conversion layer 41a.

The binder layer 41c has a surface which faces away from the conversion layer 41a and which forms a lamina top side 40 of the conversion-medium lamina 4. In particular, the lamina top side 40 is an exposed surface of the conversion-medium lamina 4. That is to say that the spatial extent of the conversion-medium lamina is delimited by the lamina top side 40.

Figure 2:
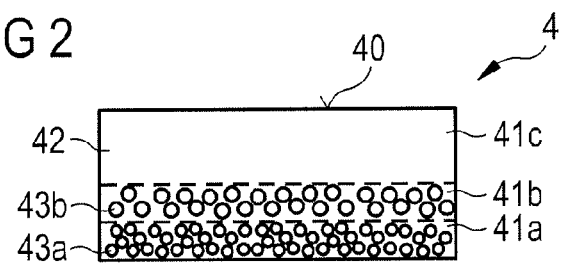
FIGS. 2 to 5 show schematic sectional illustrations of exemplary embodiments of conversion-medium laminae described here.

FIG. 2 shows a further exemplary embodiment of the conversion-medium lamina 4. In accordance with FIG. 4, the conversion-medium lamina 4 comprises two conversion layers 41a, 41b. The further conversion layer 41b is arranged between the first conversion layer 41a and the binder layer 41c. The conversion-medium particles 43a in the conversion layer 41a have a smaller diameter than the conversion-medium particles 43b in the conversion layer 41b. The two conversion layers 41a, 41b have only a thin transition region, such that the conversion-medium particles 43a, 43b are separated from one another and do not or do not significantly intermix. In particular, the first conversion layer 41a has a higher concentration of conversion-medium particles than the further conversion layer 41b. That is to say that the first conversion layer 41a has a greater proportion by volume of conversion-medium particles than the further conversion layer 41b. By way of example, the conversion-medium lamina 4 has a gradient with regard to the proportion by volume of the conversion-medium particles, wherein the proportion by volume of the conversion-medium particles decreases from the first conversion layer 41a via the further conversion layer 41b to the binder layer 41c.

The conversion-medium particles 43a having the smaller average diameter are, for example, a conversion medium for generating red light. The conversion-medium particles 43b having the larger average diameter are designed, in particular, for generating green light. By virtue of the fact that the smaller conversion-medium particles 43a are situated closer to the semiconductor chip 3 (not depicted) in a semiconductor component 1, better heat dissipation toward the semiconductor chip (not depicted) is possible. In addition, a re-absorption of green light, generated by the conversion-medium particles 43b, can be reduced in the case of this arrangement.

As a result of the good heat dissipation in particular of the lower conversion layer 41a, a higher temperature stability and a higher lifetime can be achieved, since especially red-emitting conversion-medium particles react more sensitively to increased temperatures and also exhibit a greater temperature dependence of the emitted spectrum.

Alternatively or additionally, it is possible for the conversion-medium particles which have a more greatly light-scattering effect to be situated closer to a lamina top side 40 facing away from the semiconductor chip (not depicted).

In a different manner than that illustrated, it is furthermore possible that the conversion-medium particles 43a, 43b are not present in a uniform concentration in a direction toward the lamina top side 40, rather that a concentration gradient is set. In this regard, a proportion by volume of the conversion-medium particles 43a, 43b can decrease in a direction toward the lamina top side 40. The proportion by volume of the diffusion-medium particles 45 can be uniform or increase toward the lamina top side 40. The gradient in a direction toward the lamina top side 40 can be present both with regard to the proportion by volume and alternatively or additionally with regard to a grain size distribution of the conversion-medium particles.

If a plurality of different conversion-medium particles 43a, 43b are used, then the latter can also be applied in a manner intermixed in a targeted fashion in a comparatively wide transition region, unlike the illustration shown in FIG. 2.

Figure 3:
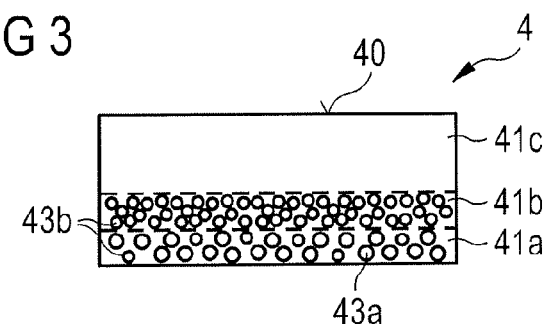

In the further exemplary embodiment of the conversion-medium lamina 4 in accordance with FIG. 3, a stacking with regard to the diameters of the conversion-medium particles 43a, 43b is reversed, in comparison with FIG. 2. The conversion-medium particles 43a having the smaller diameter pass partly into the conversion layer 41a comprising the conversion-medium particles 43a having the larger diameter.

In a different manner than that illustrated, it is possible, as also in all the other exemplary embodiments, for the conversion-medium lamina 4 to comprise more than two conversion layers 41a, 41b. By way of example, an additional conversion layer for generating yellow light can be present.

Figure 4:
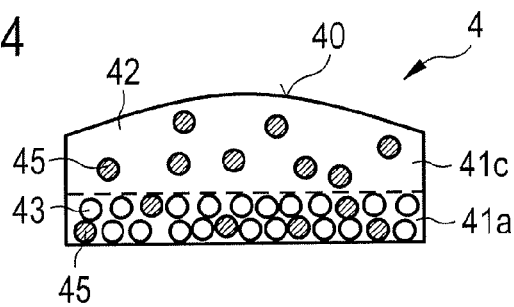

In the exemplary embodiment in accordance with FIG. 4, the conversion-medium lamina 4 additionally comprises diffusion-medium particles 45, depicted in a hatched manner. The diffusion-medium particles 45, which are formed by silicon dioxide particles, for example, can occur both in the conversion layer 41a and in the binder layer 41c, or only in one of these layers 41a, 41c. A proportion by volume of the diffusion-medium particles 45 in the conversion layer 41a can be different than or identical to a proportion by volume in the binder layer 41c. Such diffusion-medium particles 45 can also be present in all the other exemplary embodiments.

In accordance with FIG. 4, a lamina top side 40, which faces away from the semiconductor chip 3 in the semiconductor component 1, is depicted as curved. By way of example, the lamina top side 40 is shaped in the form of a converging lens. As an alternative thereto, the lamina top side 40 can also have other, non-planar shapings, for example structuring for improving the coupling-out of light or other lens forms. An underside of the conversion-medium lamina 4 situated opposite the lamina top side 40 is preferably shaped in a flat and planar fashion.

Figure 5:
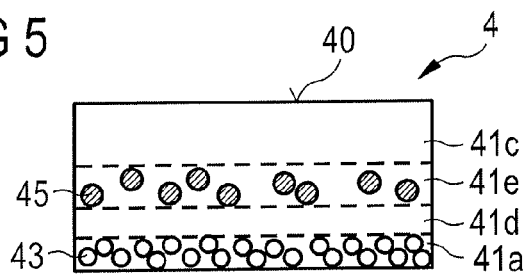

In accordance with FIG. 5, the conversion lamina 4 comprises two binder layers 41c, 41d and a scattering layer 41e situated between the two binder layers 41c, 41d. The scattering layer 41e is thus spaced apart from the conversion layer 41a. The binder layer 41c closer to the lamina top side 40 can be thicker than the further binder layer 41d in a different manner than that depicted.

FIG. 6 illustrates one exemplary embodiment of a method for producing the conversion-medium lamina 4. In accordance with FIG. 6A, an intermediate carrier 6 is provided. The intermediate carrier 6 comprises a substrate 61 and a continuous, electrically conductive layer 62, for example, composed of a transparent conductive oxide such as ITO or aluminum-doped tin oxide. It is likewise possible for the electrically conductive layer 62 to be formed from a metallic conductor.

A masking layer 7 having openings 74 is attached to a carrier top side 60. The masking layer 7 is formed from a material having a comparatively low adhesion capability with regard to the matrix material, for example, from polytetrafluoroethylene. In order to simplify the illustration, only one opening 74 in the masking layer 7 is shown in FIG. 6.

Figure 6A:
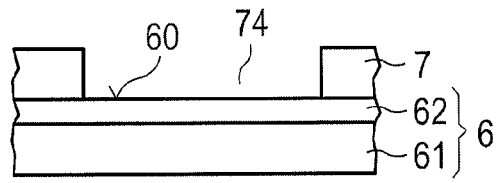
FIGS. 6A, 6B, 6C, 6D, 6E, 7, 8A, 8B and 8C show schematic illustrations of methods described here for producing conversion-medium laminae described here.
Figure 6B:
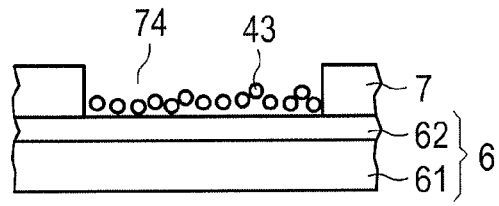

In accordance with FIG. 6B, the conversion-medium particles 43 are deposited in a targeted manner in the openings 74 on the electrically conductive layer 62. In this case, a voltage is applied to the electrically conductive layer 62 for the purpose of electrophoresis. The particles 43 are deposited in a close-packed fashion.

It may be the case that at different points in time electrophoretically different conversion-medium particles which can differ from one another with regard to the conversion material and/or the grain size distribution, or additionally the diffusion-medium particles, also having different diffusion materials or grain size distributions are deposited in one layer or in a plurality of layers, as specified in connection with FIGS. 2 to 5, in particular.

Figure 6C:
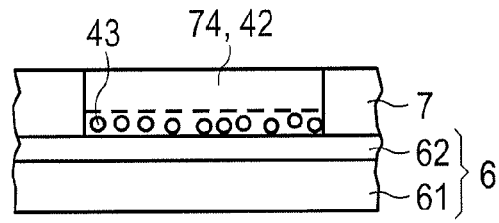

In the method step in accordance with FIG. 6C, the matrix material 42 is applied to the conversion-medium particles 43. In accordance with FIG. 6C, the opening 74 is completely filled. In a departure therefrom, it is also possible for the matrix material to project beyond the opening 74 or not to completely fill the opening 74.

The matrix material 42 is preferably applied to the conversion-medium particles 43 in a state of low viscosity such that the liquid matrix material 42 completely or partly fills interspaces between the conversion-medium particles 43 and such that a mechanically continuous conversion-medium lamina 4 arises after curing.

Figure 6D:
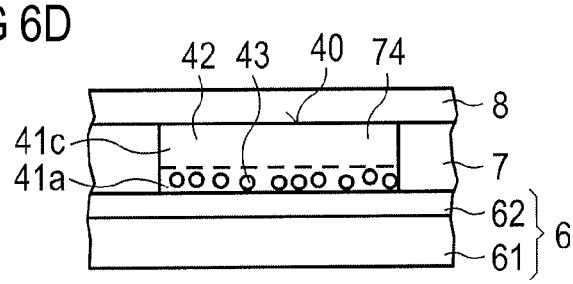
Figure 6E:
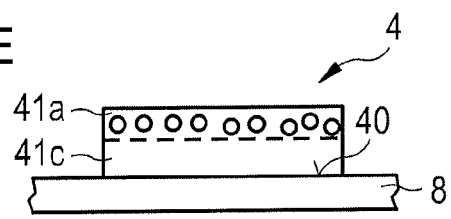

In accordance with FIG. 6D, a mounting carrier 8 is applied and, see, e.g., 6E, the conversion-medium lamina 4 is detached from the intermediate carrier 6 with the masking layer 7.

Figure 7:
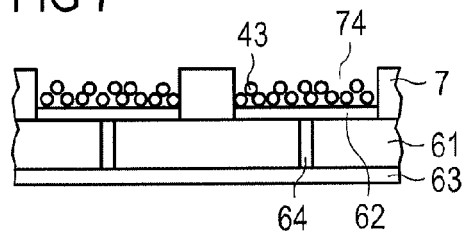

A further possibility for producing the conversion-medium lamina 4 is shown in FIG. 7. In accordance with FIG. 7, the electrically conductive layer 62 is structured and connected to an electrode 63 at the substrate 61 by means of through-holes 64. The method steps can be carried out analogous to the method in accordance with FIG. 6.

Figure 8A:
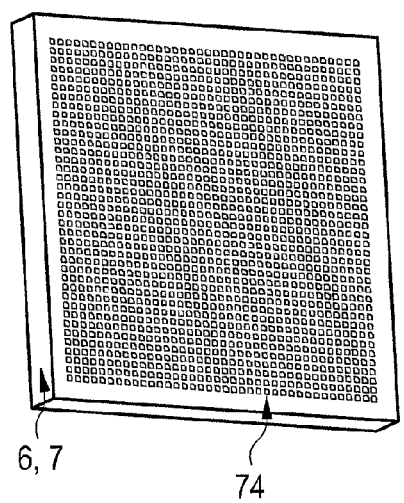
Figure 8B:
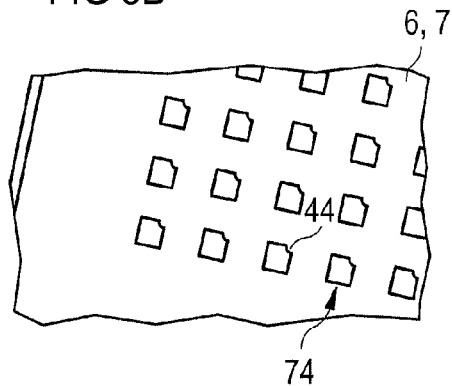
Figure 8C:
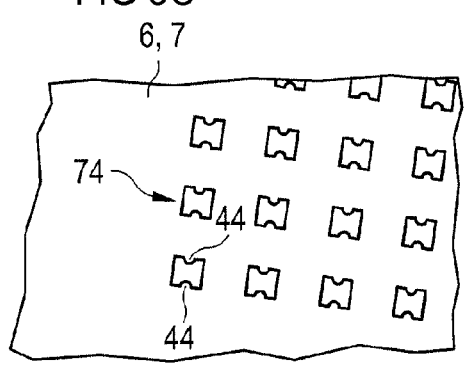

FIG. 8 shows perspective illustrations of the intermediate carrier 6 and of the masking layer 7, in an overall view in FIG. 8A. FIGS. 8B and 8C show detail views. In this case, the intermediate carrier 6 comprises a multiplicity of the openings 74.

In accordance with FIG. 8B, the openings 74 have a square basic shape, wherein an indentation 44 is present in one of the corners. By virtue of the indentation 44, a cutout for a bonding wire for making contact with the semiconductor chip can be produced in the conversion-medium lamina 4.

In accordance with FIG. 8C, two of the indentations 44 are provided at two mutually opposite longitudinal sides, and cutouts for two bonding wires can be realized via said indentations. In a departure from the illustrations in accordance with FIGS. 8B and 8C, corresponding indentations 44 can also be fashioned centrally in the openings 74 or provided in a number deviating from the illustrations.

The invention described here is not restricted by the description on the basis of the exemplary embodiments, rather the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor component comprising:
    an optoelectronic semiconductor chip designed for generating a primary radiation; and
    a conversion-medium lamina attached to a main radiation side of the semiconductor chip, the conversion-medium lamina designed for at least partly converting the primary radiation into a secondary radiation,
    wherein the conversion-medium lamina comprises a matrix material and conversion-medium particles, the conversion-medium particles comprising first and second conversion-medium particles embedded in the matrix material,
    wherein the conversion-medium lamina comprises a first conversion layer, a further conversion layer and a binder layer, the further conversion layer being arranged between the first conversion layer and the binder layer,
    wherein the first conversion layer is situated closest to the semiconductor chip, and in which the conversion-medium particles, alone or together with diffusion-medium particles, are present with a proportion by volume of at least 50%,
    wherein the binder layer is situated furthest away from the semiconductor chip and in which the conversion-medium particles have a proportion by volume of at most 2.5%,
    wherein the first conversion layer comprises the first conversion-medium particles for generating a longer-wave radiation,
    wherein the further conversion layer comprises the second conversion-medium particles for generating a shorter-wave radiation,
    wherein the first conversion-medium particles have a smaller average diameter than the second conversion-medium particles, and
    wherein a concentration of the first conversion-medium particles of the first conversion layer is higher than a concentration of the second conversion-medium particles of the further conversion layer.

2. The optoelectronic semiconductor component according to claim 1, wherein
    the first and second conversion-medium particles, alone or together with diffusion-medium particles, are present a close-packed fashion.

3. The optoelectronic semiconductor component according to claim 1, wherein the first conversion layer and the binder layer each comprise a matrix material into which the first conversion-medium particles are embedded, wherein the matrix material is a silicone, an epoxide or a silicone-epoxide hybrid material.

4. The optoelectronic semiconductor component according to claim 1, wherein the conversion-medium lamina comprises a plurality of the conversion layers, wherein the first conversion layer situated closest to the semiconductor chip comprises the first conversion-medium particles for generating red light, wherein the further conversion layer comprises the second conversion-medium particles for generating green light, and wherein the first conversion-medium particles and second conversion-medium particles, alone or together with diffusion-medium particles, are present in a close-packed fashion.

5. The optoelectronic semiconductor component according to claim 4, wherein the first and further conversion layers and the binder layer directly succeed one another and the first conversion-medium particles have an average diameter of between 0.5 µm and 5.0 µm inclusive and the second conversion-medium particles have an average diameter of between 5 µm and 25 µm inclusive.

6. The optoelectronic semiconductor component according to claim 1, further comprising a carrier having a carrier top side, wherein the semiconductor chip is attached to the carrier top side and the conversion-medium lamina is spaced apart from the carrier.

7. The optoelectronic semiconductor component according to claim 1, wherein the first and second conversion-medium particles mutually touch one another at least in part, such that in places no matrix material is situated between the first and second conversion-medium particles.

8. The optoelectronic semiconductor component according to claim 1, wherein the conversion-medium lamina has a thickness of between 30 µm and 300 µm inclusive, wherein the binder layer makes up a proportion of the thickness of the conversion-medium lamina of at least 70%.

9. The optoelectronic semiconductor component according to claim 1, further comprising a transition layer between the binder layer and the directly adjoining further conversion layer, the transition layer having a thickness of at most 1.5 times the average diameter of the first conversion-medium particles of the first conversion layer.

10. The optoelectronic semiconductor component according to claim 1, wherein the conversion-medium lamina comprises a plurality of the first conversion layers, wherein a first conversion layer situated closer to the semiconductor chip also comprises the second conversion-medium particles from the further conversion layer, and wherein the further conversion layer is free of the first conversion-medium particles from the first conversion layer situated closer to the semiconductor chip.

11. The optoelectronic semiconductor component according to claim 1, wherein the conversion-medium lamina is restricted to the main radiation side and does not project laterally beyond the semiconductor chip.

12. The optoelectronic semiconductor component according to claim 1, wherein the conversion-medium lamina comprises the diffusion-medium particles;
wherein the diffusion-medium particles are formed from a radiation-transmissive material;
wherein an average diameter of the diffusion-medium particles is between 2 µm and 6 µm inclusive; and
wherein a proportion by volume of the diffusion-medium particles in the first conversion layer is at most 2.5% and in binder layer is between 1.0% and 20% inclusive.

13. The optoelectronic semiconductor component according to claim 1, wherein the first conversion-medium particles are configured for generating red light and the second conversion-medium particles are configured for generating green light.

14. The optoelectronic semiconductor component according to claim 1, wherein the conversion-medium lamina has a gradient with regard to a proportion by volume of the first conversion-medium particles, and wherein the proportion by volume of the first conversion-medium particles decreases from the first conversion layer via the further conversion layer to the binder layer.

15. The optoelectronic semiconductor component according to claim 1, wherein the binder layer has a proportion of a thickness of the conversion-medium lamina of at least 60% and is configured to mechanically support the conversion-medium lamina.

16. A conversion-medium lamina for an optoelectronic semiconductor component comprising a matrix material and conversion-medium particles embedded therein, wherein:
the conversion-medium lamina comprises one or more conversion layers in which the conversion-medium particles, alone or together with diffusion-medium particles, are present with a proportion by volume of at least 50%;
the conversion-medium lamina comprises a binder layer in which the conversion-medium particles have a proportion by volume of at most 0.5%;
the conversion-medium lamina is mechanically self-supporting;
the conversion-medium lamina comprises a first conversion layer and a further conversion layer, wherein the further conversion layer is arranged between the first conversion layer and the binder layer;
the first conversion layer comprises first conversion-medium particles for generating a longer-wave radiation and the further conversion layer comprises second conversion-medium particles for generating a shorter-wave radiation;
the first conversion-medium particles have a smaller average diameter than the second conversion-medium particles; and
a concentration of first conversion-medium particles of the first conversion layer is higher than a concentration of the conversion-medium particles of the further conversion layer.

17. The conversion-medium lamina according to claim 16, wherein the one or more conversion layers and the binder layer each comprise a matrix material into which the first conversion-medium particles are embedded, wherein the matrix material is a silicone, an epoxide or a silicone-epoxide hybrid material.

18. The optoelectronic semiconductor component according to claim 16, wherein the conversion-medium lamina has a gradient with regard to a proportion by volume of the first conversion-medium particles, and wherein the proportion by volume of the first conversion-medium particles decreases from the first conversion layer via the further conversion layer to the binder layer.

19. A method for producing the conversion-medium lamina for an optoelectronic semiconductor component, wherein the conversion-medium lamina comprises a matrix material and conversion medium particles embedded therein, the conversion-medium lamina comprises one or a plurality of conversion layers in which the conversion-medium particles, alone or together with diffusion-medium particles, are present with a proportion by volume of at least 50%, wherein the conversion-medium lamina comprises a binder layer in which the conversion-medium particles have a proportion by volume of at most 0.5%, and wherein the conversion-medium lamina is mechanically self-supporting, the method comprising:
- providing an intermediate carrier having a top side;
- applying the conversion-medium particles to the top side;
- after applying the conversion-medium particles, applying the matrix material to the conversion-medium particles;
- curing the matrix material; and
- detaching the conversion-medium lamina from the intermediate carrier, wherein applying the conversion-medium particles is carried out by electrophoresis.

20. The method according to claim 19, wherein the intermediate carrier comprises an electrically insulating masking layer, wherein the masking layer has a plurality of openings, wherein the conversion-medium particles and the matrix material are applied in a targeted manner in the openings, and wherein a shape of the conversion-medium lamina, as seen in plan view, is predefined by the openings.

* * * * *